United States Patent [19]

Apgar et al.

[11] 4,029,351
[45] June 14, 1977

[54] BERNOULLI PICKUP HEAD WITH SELF-RESTORING ANTI-TILT IMPROVEMENT

[75] Inventors: Donald Harlem Apgar, Binghamton; Richard Fleming Kilburn, Vestal, both of N.Y.

[73] Assignee: International Business Machines Corporation, Armonk, N.Y.

[22] Filed: June 2, 1976

[21] Appl. No.: 692,068

[52] U.S. Cl. ............................... 294/64 B; 271/97
[51] Int. Cl.² ......................................... B66C 1/02
[58] Field of Search ............. 294/64 R, 64 A, 64 B, 294/65; 214/1 BS; 226/7, 95, 97; 269/21; 271/97, 195; 302/29, 31

[56] References Cited
UNITED STATES PATENTS

| 3,438,668 | 4/1969 | Olsson et al. | 294/64 B |
|---|---|---|---|
| 3,466,079 | 9/1969 | Mammel | 294/64 B |
| 3,517,958 | 6/1970 | Boucher et al. | 294/64 B |
| 3,523,706 | 8/1970 | Logue | 294/64 B |
| 3,539,216 | 11/1970 | Forcier | 294/64 B |

OTHER PUBLICATIONS

"Wafer Pickup Head", Leoff et al., IBM Technical Disclosure Bulletin, vol. 14, No. 8, Jan. 1972, pp. 2311–2312.

Primary Examiner—Johnny D. Cherry
Attorney, Agent, or Firm—Norman R. Bardales

[57] ABSTRACT

A pickup head, which is of the type referred to in the art as a Bernoulli pickup head, is used to lift and/or transport a semiconductor wafer. The head is provided with a central positive pressure gas coupled orifice or port and at least three auxiliary positive pressure gas coupled orifices disposed symmetrically about the central orifice. The gas flow from the central orifice effects the main lifting force and the gas flow from the auxiliary orifices effects additional restoring torque to correct for any wafer tilt, if present. Thus, the integrity of the non-contacting relationship between the head and wafer surface is enhanced and/or preserved and this is particularly advantageous on lift-off.

10 Claims, 2 Drawing Figures

BERNOULLI PICKUP HEAD WITH SELF-RESTORING ANTI-TILT IMPROVEMENT

BACKGROUND OF THE INVENTION

1. Field of the Invention

This invention is related to pickup heads and more particularly to pickup heads of the Bernoulli type.

2. Description of the Prior Art

The use of a gaseous medium such as air to support and/or lift articles is well known in the art and includes such devices as pickup heads and air track systems, for example.

In certain devices suction, i.e. vacuum or more specifically devices using a negative pressure source, is employed to lift and/or support an article. For example, a vacuum-operated pickup head for handling a filter membrane or disk is described in U.S. Pat. No. 3,608,946. However, in many applications, such as for example, the processing and handling of semiconductor wafers, the use of a vacuum device is undesirable because physical contact between the article and pickup device caused by the suction is relied upon to effect the handling. Such physical contact makes the articles susceptible to contamination and/or damage.

Other devices use a positive pressure source to lift an article. In certain types of these devices the gas is simply discharged directly against the under surface of the article to be supported or lifted with sufficient force to overcome the weight of the article to be lifted. Generally, in these certain types, should the article become displaced with respect to the gas discharge, either laterally or by tilting, the article is susceptible to being placed in contacting relationship with the device per se and/or other objects. Thus, while these certain types of devices are utilized in application such as the processing and/or handling of semiconductor wafers, the physical contact makes the article susceptible to contamination and/or damage.

The air track system described in the publication entitled "Stabilizing Jets For Air Cushion Levitated Wafer", F. Hendriks, IBM Technical Disclosure Bulletin, Vol. 18, No. 5, October 1975, page 1664, is an example of a device that employs the force of a gas discharge against the undersurface of a semiconductor wafer for levitation, lateral centering and propulsion of the wafer along the track. In addition, it provides two extra jets that are positioned on each side of the track an which direct gas discharges at an inward inclination to the top surface of the wafer to suppress certain wafer tilt, i.e. tilt about the propulsion axis. However, wafer tilt about other axes, i.e. axes which are skewed with the propulsion axis such as the lateral axis which is orthogonal to the propulsion axis, is not correctable by this device. Moreover, because this device requires interaction with both surfaces of the wafer, it is not desirable or applicable to pickup heads which react, i.e. coact, with only one surface of the article as the other surface is generally obstructed in its rest position prior to lift-off.

Other types of devices which employ a positive pressure source to lift or support an article are the so called Bernoulli types. An example of a Bernoulli type support system for supporting elongated and/or contiguous sheets of flexible metallic stock is described in U.S. Pat. No. 3,198,499 and its related divisional U.S. Pat. No. 3,319,856. While this system provides for restoring the sheet of metal if it becomes laterally displaced, it had no means for restoring the sheet should it become tilted.

Examples of Bernoulli type pickup heads are described in the following references, to wit: U.S. Pat. Nos. 3,438,668; 3,523,706 assigned to the common assignee herein; 3,539,216 and publications entitled "Wafer Pickup With Air Barrier", C. P. Hayunga; "Wafer Holder", G. O. Stenger; "Orienting Bernoulli Effect Wafer Transfer Mechanism", H. Von Burg et al, appearing in the IBM Technical Disclosure Bulletin, Vol. 11, No. 2, July 1968, page 112; Vol. 13, No. 7, December 1970, page 2081; and Vol. 18, No. 6, November 1975, pages 1836, 1837, respectively. All of these devices have a main orifice, or series of orifices, coupled to a positive pressure source and are utilized to lift an article, i. e. a semiconductor wafer. Some of the devices, in addition, are provided with auxilairy ports that are also coupled to a positive pressure source so as to provide or impart a predetermined translation to the wafer in its horizontal plane, cf. U.S. Pat. Nos. 3,523, 706, FIGS. 2, 2A and 3,539,216. None of the devices, however, provide means for restoring the wafer should it become tilted. It should be noted that the device described in the aforementioned publication issue of July, 1968 has a head configuration with a main central port and three symmetrical exhaust ports. These three exhaust ports are used to direct the air flow, which comes from center port, so that it mainly exhausted in an upward and outward manner through the device thereby eliminating air flow between the periphery of the wafer and the head where the air flow might disturb an adjacent neighboring wafer. As is obvious, these exhaust ports are not coupled to a positive pressure supply and/or neither do they provide a restoring force and/or torque to the wafer should it become tilted.

For the same reasons as the vacuum type per se devices are undesirable for certain applications such as wafer processing and/or handling, so are devices which employ combinations of vacuum, i.e. suction, and the so-called Bernoulli effect. More specifically, in these devices, if the positive pressure utilized for the Bernoulli effect is diminished or stopped, the vacuum would cause the article to be placed in contact with the device. Examples of such combination type pickup heads and systems are described in the following references, to wit: U.S. Pat. Nos. 3,220,723; 3,517,958 and the publication entitled "Wafer Pickup Head", A. Leoff et al, IBM Technical Disclosure Bulletin, Vol. 14, No. 8, January 1972, pages 2311, 2312. Moreover, none of these combination type devices provide means for restoring the article should the article become tilted.

SUMMARY OF THE INVENTION

It is an object of this invention to provide an improved Bernoulli type pickup head for lifting and supporting articles.

Another object of this invention is to provide a pickup head of the aforementioned kind that mitigates and/or prevents omnidirectional tilting of the article being lifted and/or supported thereby.

Still another object of this invention is to provide a pickup head of the aforementioned kind which self-restores a tilted article being lifted or supported thereby.

Still another object of this invention is to provide a pickup head of the aforementioned kind for handling semiconductor wafers, and the like.

According to one aspect of the invention, there is provided pickup apparatus of the Bernoulli type for lifting an article for support thereby. The article has a predetermined planar surface. The apparatus includes a pickup head. Main orifice means are centrally disposed on the pickup head and are adapted to be coupled to a positive pressure gas supply. The main orifice means provides a gas flow discharge therefrom towards the predetermined planar surface for effecting the lifting and support of the article. In addition, at least three auxiliary orifice means are disposed on the pickup head in a predetermined symmetrical manner about said main orifice means. The auxiliary orifice means are adapted to be coupled to a positive pressure gas supply, which may be common or independent of that used for the main orifice means. The auxiliary orifice means provide gas flow discharges therefrom towards the predetermined surface for effecting a restoring torque to the wafer whenever the planar surface becomes tilted with respect to the pickup head.

The foregoing and other objects, features and advantages of the invention will be apparent from the following more particular description of a preferred embodiment of the invention, as illustrated in the accompanying drawing.

BRIEF DESCRIPTION OF THE DRAWING

In the FIGURES, like elements are designated with similar reference numerals.

DESCRIPTION OF THE PREFERRED EMBODIMENT

Figure 1:
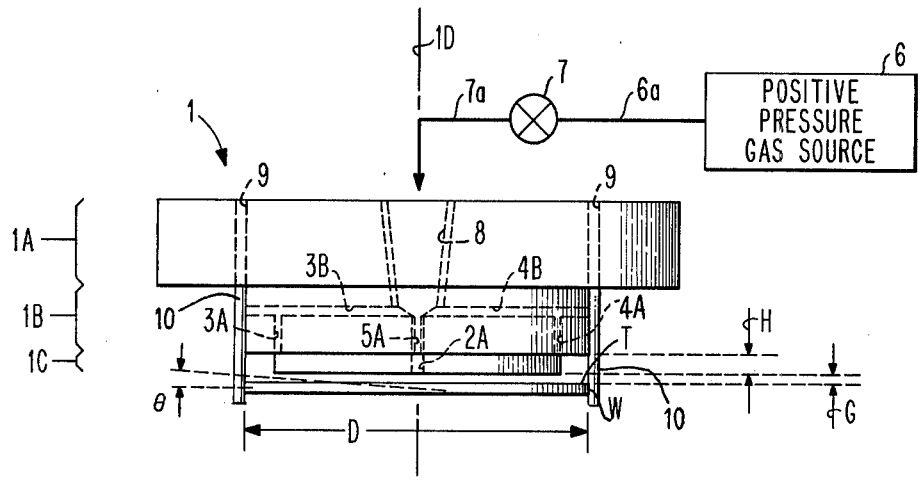
FIG. 1 is a front elevation view of a preferred embodiment of the present invention.
Figure 2:
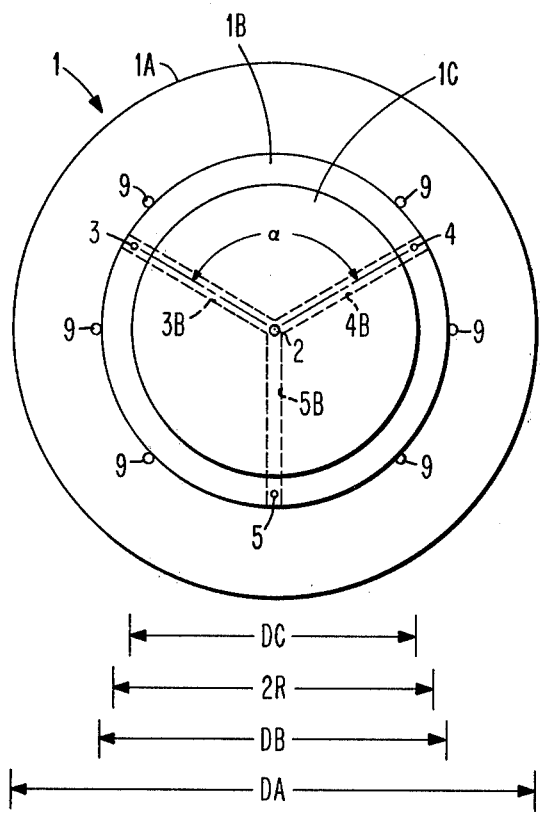
FIG. 2 is a bottom plan view of the preferred embodiment shown in FIG. 1.

Referring to FIGS. 1 and 2, the pickup apparatus has a pickup head generally indicated by the reference numeral 1. Head 1 is of the Bernoulli type and has a main orifice means which in the preferred embodiment is a single orifice or port 2, cf. FIG. 2. The main orifice means is centrally disposed on the pickup head 1 and is adapted to be coupled to a positive pressure gas supply hereinafter described.

In the preferred embodiment, pickup head 1 is configured as three cylindrical sections 1A, 1B, 1C, which are concentrically aligned with the center axis 1D and have respective diameters DA, DB, DC, where DA>DB>DC. The pickup apparatus of the present invention is used to pick up an article having a predetermined planar surface with which it coacts and more particularly, as shown in FIG. 1, it is preferably utilized to pick up a semiconductor wafer W, which is generally circular, by coacting with its upper planar surface T. For sake of clarity, the wafer W is not shown in FIG. 2. The gas flow discharge from orifice 2 towards surface T effects the lifting and support of wafer W in accordance with the principles associated with Bernoulli pickup head types and in a manner well known to those skilled in the art.

In accordance with the principles of the present invention, head 1 is provided with at least three auxiliary orifice means and which in the preferred embodiment are three single ports 3, 4, 5, respectively, cf. FIG. 2. The auxiliary orifice means are disposed on the head in a symmetrical manner about the main orifice means and, hence, central axis 1D. Thus, in the preferred embodiment, the three auxiliary ports or orifices 3, 4, 5 are symmetrically disposed about the main orifice 2 an equidistance radius R from the center axis of orifice 2 with an angular spacing $\alpha$ of 120°. These auxiliary orifices are adapted to be coupled to a positive pressure gas supply and which in the preferred embodiment is a supply common to both the main and auxiliary orifices 2 – 5, as hereinafter described. The gas flow discharges from the auxiliary ports 3 – 5 towards surface T effect a restoring torque to wafer W should the wafer W and, hence, surface T tend to tilt in any direction with respect to the pickup lead 1. As shown in FIG. 1, the wafer W is lifted and supported by head 1 in a generally parallel relationship with the planar surfaces of of the head 1. Thus, for example, if the wafer W should tilt an angle $\theta$ about its diameter which is perpendicular to the plane of FIG. 1, the aforementioned restoring torque self restores wafer W to the aforementioned parallel relationship. To minimize and/or mitigate the lifting forces effected by the radial flow of the jets from the auxiliary orifices 3 – 5, the radius R is judiciously selected to be slightly smaller than the radius of the wafer. As a result, the restoring torque is optimized. Thus, the auxiliary orifices 3 – 5 are positioned so that their respective gas discharge or jets impinge the surface T at a point near to the peripheral edge of the wafer W, a spacing of 1/16th inches = 1.5875 millimeters between the peripheral edge and point of impingement being typical, for example.

For sake of clarity and simplicity, the positive pressure gas supply system is shown schematically in FIG. 1. The system includes a positive pressure gas source 6, e.g. such as air, which is connected to an on/off valve 7 that is in turn coupled to a tapered threaded connector, not shown, the interconnecting tubing being indicated by the lines 6a, 7a. The tapered connector, not shown, threadably engages the threaded and center aligned tapered bore 8 which in turn communicates with port 2 via vertical bore 2A and ports 3 – 5 via respective vertical bores 3A, 4A, 5A and their interconnected radial bores 3B, 4B, 5B. As such, the pickup head is readily and simply fabricated, it being understood that each of the radial bores 3B – 5B is sealed, for example, by a plug, not shown for sake of clarity, which threadably engages the particular radial bore at the open end thereof located on the circumferential surface of section 1B of head 1.

If desired, suitable means may be provided to restrict lateral movement of the wafer W when being supported by head 1. For example, section 1A of head 1 may be provided with plural vertical bores, i.e. bores 9, which are aligned on a common circumference and which are preferably tangential to the circumferential edge of section 1B. The upper ends of elongated cylindrical guide pins 10, only two of which are shown in FIG. 1 for sake of clarity, are force fit into the bores 9 upwardly from the bottom surface of section 1A so that the guide pins 10, not shown in FIG. 2 for sake of clarity, project downwardly and encompass the circumferential edge of the wafer W when the latter is being supported by head 1 with a slight tolerance being provided between the guide pins 10 and the edge of wafer W. The guide pins 10 thus aid in the keeping the wafer W under head 1. To allow the air to flow freely out from the zone between the wafer W and head 1, none of the guide pins 10 are placed in radial alignment with the auxiliary ports 3, 4, 5, cf. relationship of bores 9 and ports 3, 4, 5 in FIG. 2. By judiciously selecting the diameter of these guide pins to be as small as possible, disturbance of the air flow is further minimized.

In operation, the Bernoulli pickup head 1 is brought close to the planar surface T of wafer W and the normally turned off valve 7 is turned on. Air from the pressure source 6 flows through orifice 2 into the zone between and the head 1 and surface T and then radially outwards to the ambient atmosphere. A pressure field is established by the flow in the zone between surface T and head 1. The net effect of this pressure field is to apply a lifting force to the wafer W which results in the vertical displacement of the wafer W up close to the head where a stable air gap G is established between surface T and head 1. The head 1 may then be transported to a new location bearing the wafer W along with it in its non-contacting relationship. At the new location, valve 7 is turned off and the wafer drops away from the head 1.

With the valve 7 turned on, the auxiliary orifices 3 - 5 via their respective equipressure gas discharges maintain the wafer W, i.e. surface T, in substantially parallel orientation with respect to the planar surface of the head 1 both on lift off and during the subsequent suspension thereof at the normal gap G. Furthermore, should the wafer tend to tilt, one side of the wafer is placed in somewhat closer proximity to the head 1 so that the moments produced about the tilt axis by the auxiliary discharges or jets provide a restoring torque which self-restores the wafer to the predetermined parallel position.

Preferably, the auxiliary orifices 3 - 5 are recessed a sufficient height H from the lower face of the head 1 so as to provide another means for minimizing and/or mitigating the lift produced by the auxiliary jets. For example, a height H of ⅛th of an inch = 3.175 millimeters is typical. Also, preferably the diameter DB of section 1B of head 1 is substantially equal to the diameter D of the wafer W.

By way of example, typical dimension parameters for a pickup head 1 for lifting a silicon circular wafer of nominal size diameter D = 2¼ inches = 57.150 millimeters are shown in the following table, to wit:

TABLE I

| Diameter | Inches | Millimeters |
|---|---|---|
| DA | 3.500 | 88.900 |
| DB | 2.250 | 57.150 |
| DC | 1.875 | 47.625 |
| 2R | 2.125 | 53.975 |
| Orifice 2 | 0.062 | 1.575 |
| Orifices 3-5, each | 0.020 | 0.508 |
| Bores 3B-5B, 9, each | 0.062 | 1.575 |

A typical positive pressure for source 6 for the given example is 4 psi = 27,579 pascals for lifting a semiconductor wafer of 0.01 pounds = 4.535 grams from a rest position which is spaced 0.09 inches = 2.286 millimeters from the bottom surface of the head 1.

If desired, a concentric circular recess, not shown, may be provided about orifice 2 in the lower face of section 1C to increase the magnitude of the gap G. For the given example in which an orifice 2 with a 1.575 millimeter diameter is utilized, typical dimension parameters for the lastmentioned recess are a one inch = 25.4 millimeter diameter and a recess height of 0.005 inches = 0.127 millimeters.

The Bernoulli pickup head apparatus of the present invention is thus a simple device which can lift and transport a wafer W without touching it, i.e. in particular its planar surface T. Its self-restoring and omnidirectional antitilt capability prevent and/or mitigate collisions of the wafer W and the head 1 and particularly so on lift off. It should be understood that in the prior art pickup heads, one of the predominate causes of collision and most difficult to cure problems is on lift off where the wafer is most apt to become tilted and thus strike the head at one point of its periphery resulting in damage and/or contamination to the wafer. The provision of the gas discharges from the auxiliary orifices in the present invention provides a downward thrust to the wafer which reduces the total lift, i.e. upward force, on the wafer and which thrust is related to the momentum of the gas discharge from the auxiliary orifices, and thus controls the parallel orientation stability of the wafer W, particularly on liftoff.

It should be understood that in the preferred embodiment the main orifice means is a single orifice 2. However, as is apparent to those skilled in the art, the main orifice means may be multi-orificed. Likewise, each of the auxiliary orifice means may also be modified to be multiorificed. Moreover, in the preferred embodiment, the pickup head 1 is circularly configured and is preferably adapted to coact with an article having a circular configuration. It should be understood that the pickup head 1 of the preferred embodiment can be utilized to pick up articles having other symmetrical or asymmetrical configurations and/or the head can be modified to have other configurations such as, for example, triangular, rectangular, etc.

It should also be understood that the head 1 in the preferred embodiment has two sections 1B and 1C so as to provide for the recessing of the auxiliary orifices 3 - 5 as aforementioned. Alternatively, the head could be modified to include a single section which contains both the main orifice and the auxiliary orifices, the latter being recessed therein, by counterboring for example, so as to minimize and/or mitigate the lifting forces from the auxiliary jets.

Thus, while the invention has been particularly shown and described with reference to a preferred embodiment thereof, it will be understood by those skilled in the art that various changes in form and details may be made therein without departing from the spirit and scope of the invention.

1. Pickup apparatus of the Bernoulli type for lifting an article for support thereby, said article having a predetermined planar surface, said apparatus comprising:
    a pickup head,
    central main orifice means disposed on said pickup head and adapted to be coupled to a positive pressure gas supply, said main orifice means providing a gas flow discharge therefrom towards said predetermined planar surface for effecting the lifting and support of said article, and
    at least three auxiliary orifice means disposed on said pickup head in a predetermined symmetrical manner about said main orifice means and adapted to be coupled to a positive pressure gas supply, said auxiliary orifice means providing gas flow discharges therefrom towards said predetermined surface for effecting a restoring torque to said article whenever said planar surface becomes tilted in any direction with respect to said pickup head.

2. Pickup apparatus according to claim 1 wherein said main orifice means and each of said auxiliary orifice means comprise single orifices.

3. Pickup apparatus according to claim 1 wherein said auxiliary orifice means are disposed in a first plane and said main orifice means is disposed in a second plane parallel to said first plane, said first plane being more remote than said second plane with respect to said predetermined planar surface.

4. Pickup apparatus according to claim 1 wherein said main orifice means and said auxiliary orifice means are adapted to be coupled to a common positive pressure gas supply.

5. Pickup apparatus according to claim 1 wherein said article comprises a semiconductor wafer having a predetermined configuration.

6. Pickup apparatus according to claim 5 wherein said predetermined configuration is circular.

7. Pickup apparatus according to claim 6 wherein said pickup head further comprises a first lower and a second upper cylindrical and concentrically aligned sections, said first section having a diameter smaller than the diameter of said second section, said first section further having said main orifice means concentrically disposed thereon and being adapted to be juxtaposed to said predetermined planar surface and in concentric alignment therewith, said second section having said auxiliary orifice means disposed thereon and being adapted to juxtaposed to said planar surface.

8. Pickup apparatus of the Bernoulli type for lifting a circular planar semiconductor wafer for support thereby, said wafer having a predetermined diameter magnitude and a predetermined planar surface for coacting with said apparatus, said apparatus comprising:
a pickup head having upper, middle and lower cylindrical sections concentrically aligned about a common vertical axis of said head, said upper, middle and lower sections having first, second and third diameter dimensions, respectively, of decreasing magnitude, said second diameter dimension being substantially equal to said wafer diameter magnitude,
a central orifice disposed on said lower section concentrically about said central vertical axis and in facing relationship to said planar surface at the center of said wafer, and
at least three auxiliary orifices disposed on said middle section in a predetermined symmetrical manner about said central orifice and in facing relationship to said planar surface between the circumferential periphery and center of said wafer, and
means for coupling said main and auxiliary orifices to a positive pressure gas supply, said main orifice providing a gas flow discharge therefrom towards said planar surface at the center of said wafer for effecting the lifting and support of said wafer, said auxiliary orifices providing gas flow discharges therefrom towards said predetermined surface between said circumferential periphery and center of said wafer for effecting a restoring torque to said wafer whenever said planar surface becomes tilted with respect to said head.

9. Apparatus according to claim 8 wherein said means for coupling further comprises:
a first central bore disposed in said upper and middle sections concentrically about said center axis,
a second central bore disposed in said middle and lower sections concentrically disposed about said center axis, said second central bore connecting said main orifice to said first central bore, and
a plurality of pairs of vertical and radial bores, the vertical and radial bores of each particular pair being interconnected with respect to each other and disposed in said middle section to connect a mutually exclusive middle one of said auxiliary orifices to said first central bore, said first central bore being connectable to said positive pressure gas supply.

10. Pickup apparatus according to claim 9 further comprising:
means to restrict the lateral motion of said wafer under said head.

* * * * *